United States Patent
Scherer et al.

(10) Patent No.: US 6,266,803 B1
(45) Date of Patent: Jul. 24, 2001

(54) METHOD FOR PLACEMENT OF CLOCK BUFFERS IN A CLOCK DISTRIBUTION SYSTEM

(75) Inventors: Alisa M. Scherer, Sunnyvale; Frederick Weber, San Jose, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/076,679

(22) Filed: May 12, 1998

Related U.S. Application Data

(62) Division of application No. 08/632,966, filed on Apr. 15, 1996, now Pat. No. 5,790,841.

(51) Int. Cl.[7] ................................................. G06F 17/50
(52) U.S. Cl. ................................ 716/12; 716/8; 716/10; 716/13; 716/9
(58) Field of Search ........................................ 716/13, 12

(56) References Cited

U.S. PATENT DOCUMENTS

| 5,012,427 | 4/1991 | Kuribayashi . | |
|---|---|---|---|
| 5,013,942 | * 5/1991 | Nishimura et al. | 307/480 |
| 5,140,184 | * 8/1992 | Hamamoto et al. | 307/303.1 |

(List continued on next page.)

FOREIGN PATENT DOCUMENTS 0 646 854 A2   4/1995   (EP) .

OTHER PUBLICATIONS

Zhu et al., Package Clock Distribution Design Optimization for High–Speed and Low–Power VLSI's, IEEE Transactions on Components, Packaging and Manufacturing Technology, pp. 56–63.*

Blair, G.M.: Skew–Free Clock Distribution for Standard–Cell VLSI Designs, IEE Proceedings G. Electronic Circuits & Systems, vol. 139, No. 2, Apr. 1992, pp. 265–267, XP000300862.

Cho, Jun Dong, et al.: "A Buffer Distribution Algorithm for High–Performance Clock Net Optimization", IEEE Transactions on Very Large Scale Integration (VLSI) Systems, vol. 3, No. 1, Mar. 1995, pp. 84–98, XP000500304.

Montuno, D.Y., et al.: "A Layout Methodology for the Synthesis of High Speed Global Clock Nets", Proceedings of the IEEE 1992 Custom Integrated Circuits Conference, Boston Massachusetts, May 3–6, 1992, pp. 28.4–28.4.4, XP000340976.

*Primary Examiner*—Matthew Smith
*Assistant Examiner*—A. M. Thompson
(74) *Attorney, Agent, or Firm*—Skjerven Morrill MacPherson LLP; Edward C. Kwok, Esq.

(57) ABSTRACT

A method for routing clock signals in an integrated circuit provides a hierarchical routing scheme in which the lowest level clock buffers are first placed row by row in preallocated locations and routed to the input pins of standard cells receiving the output clock signals of these clock buffers. Under the method, the number of clock buffers to be placed in each row is computed according to estimates of their load capacitances and expected wiring lengths within a window. The output buffers of the same clock signal are gridded or strapped together to minimize clock skew. A second level of clock buffers are then assigned to drive the lowest level buffers. The hierarchy can be extended to any number of higher levels, until clock signals are routed for the entire integrated circuit. The higher level clock signals can also be strapped or gridded to minimize clock skew.

12 Claims, 3 Drawing Sheets

U.S. PATENT DOCUMENTS

| | | |
|---|---|---|
| 5,172,330 | 12/1992 | Watanabe et al. . |
| 5,410,491 | 4/1995 | Minami . |
| 5,430,397 | 7/1995 | Itoh et al. . |
| 5,467,033 | 11/1995 | Yip et al. . |
| 5,481,209 * | 1/1996 | Lim et al. ............................... 326/96 |
| 5,519,351 * | 5/1996 | Matsumoto ........................... 327/295 |
| 5,564,022 | 10/1996 | Debnath et al. . |
| 5,656,963 * | 8/1997 | Masleid et al. ....................... 327/297 |
| 5,774,371 * | 6/1998 | Kawakami ............................ 364/491 |
| 5,880,607 * | 3/1999 | Mitra ..................................... 326/93 |

* cited by examiner

METHOD FOR PLACEMENT OF CLOCK BUFFERS IN A CLOCK DISTRIBUTION SYSTEM

This is a division of application Ser. No. 08/632,966, filed Apr. 15, 1996, now, U.S. Pat. No. 5,790,841, issued Aug. 4, 1998. U.S. Pat. No. 5,790,841 is hereby incorporated by reference.

CROSS REFERENCE TO APPENDIX INCLUDING COMPUTER PROGRAM LISTINGS

Appendices A–H, which are integral parts of the present disclosure, include a listing of a computer program and its related data in one embodiment of this invention. This computer program listing contains material which is subject to copyright protection. The copyright owner, NexGen Microsystems Inc., which is also the Assignee of the present patent application, has no objection to the facsimile reproduction by anyone of the patent document or the present disclosure, as it appears in the Patent and Trademark Office patent files or records, but otherwise reserves all copyrights whatsoever.

BACKGROUND OF THE INVENTION

1. Field of the Invention

The present invention relates to integrated circuit designs. In particular, the present invention relates to the design of a distribution system for clock signals in an integrated circuit.

2. Discussion of the Related Art

"Clock skew" is a measure of uncertainty in the arrival times of a clock signal transition at different locations of a synchronous logic circuit, such as a microprocessor. Clock skews are undesirable since they adversely impact the operating frequency attainable by the logic circuit. Consequently, clock skews should be minimized. Clock skew can arise, for example, from RC delays in the interconnect wires between circuit elements, mismatches in the capacitive loads presented to clock buffers, and mismatches of driver sizes in clock buffers distributing the clock signals.

In the prior art, the clock distribution system (i.e. the placement of clock buffers and the routing of clock signals) in a full-custom microprocessor is often hand-crafted to minimize clock skew. Clearly, such procedure is time-consuming.

As the complexity of microprocessors grows, microprocessor designs have become "semi-custom". In a semi-custom design, building blocks such as macros (e.g. regularly placed memory cells), arrayed logic elements (e.g. elements in data paths and register files) and standard cells (e.g. "random" logic) are used. Such building blocks are typically developed with automatic tools, such as logic synthesis, automatic placement and routing tools, which render the design task highly automated and efficient. However, as the design tasks are automated, hand-crafting the clock distribution system has become highly complex and impractical.

Clock distribution in a semi-custom design must take into account the nature of the various building blocks in the circuit. For example, within a custom macro block, the designer can still carefully place each transistor, route the wires for the clock signals and, where necessary, provide careful buffering of clock signals. In such a design, the designer can specify a "zero-skew" point, which is typically an entry point of the clock signal into the macro. Because the designer maintains control over placement and routing of the clock signals, clock skews within a custom macro block can usually be controlled by design decisions.

Arrayed logic elements, which are highly regular and with planned wiring locations built-in, allow a disciplined clock signal distribution strategy, as the total clock loading for the array and appropriate placements of clock buffers can be fairly accurately determined. Often, however, such arrayed logic element are placed and routed by automated tools. Such tools must be carefully directed to achieve the desired routing of clock signals.

Logic circuits built from standard cells belong to the most difficult class of circuits to route clock signals. Standard cell designs are primarily generated using a logic synthesis tool. In such a design, the designer provides the logic synthesis tool with a set of logic equations which express the desired logic circuit functionally. The synthesis tool then generates the implementation of the logic circuit, selecting circuit elements (e.g. logic gates) from a standard cell library. Various optimization techniques are typically applied to achieve such objectives as high cell density and gate minimization. Thus, the designer usually has no accurate means for predicting the sizes and locations of the capacitive loads driven by the clock signals, so that the number of clock buffers needed to adequately drive these capacitive loads and their optimal placements are not known in advance. Further, even for minor modification of the circuit, the logic synthesis tool often generates a radically different circuit topology for the circuit, such that a different clock distribution network may be required with each modification.

Because macros, arrayed logic and standard cells can often all be found in a semi-custom circuit, such as a microprocessor integrated circuit, it is desirable to have an automatic design tool which takes into account the different natures of these building blocks in placing clock buffers and routing clock signals, so as to achieve minimal clock skew in the integrated circuit.

SUMMARY OF THE INVENTION

The present invention provides a method for assigning clock buffers and routing clock signals to various regions of an integrated circuit with minimal clock skew. According to the present invention, a preassigned clock buffer area is allocated to each of various regions of an integrated circuit. In accordance to one aspect of the present invention, a method is provided which is particularly suited to assigning clock buffers in an area where the logic circuit is implemented by standard cells. According to this method, for each clock signal to be routed and for each row of the standard cells, the following steps are carried out: (a) identifying those standard cells receiving the clock signal, (b) associating an input capacitance with each of the identified standard cells, (c) for each identified standard cell, deriving a wire capacitance associated with the identified standard cell, the wire capacitance being derived by estimating a length of wire necessary to electrically couple the clock signal from the assigned buffer area to the identified standard cell, and (d) deriving a row capacitance by summing all of the input capacitances and the wire capacitances within the row of standard cells. Then, this method selects, in a predetermined order, each row of the standard cells, and performs, for the selected row of standard cells, the steps of (a) determining a window capacitance by summing row capacitances for selected rows of standard cells neighboring the selected row of standard cells, (c) determining a number of clock buffers to assign to the selected row of standard cells by dividing the window capacitance by the preferred load and a number derived from the number of the neighboring rows of standard cells, and (d) placing the number of clock buffers within the assigned buffer area.

The method of the present invention can be performed in conjunction with a sliding window moving from a row closest to one side of the area towards the opposite side of the area. In that approach, a predetermined number of neighboring rows of standard cells are included in the sliding window for each row of standard cells for which a clock buffer placement is considered. According to another aspect of the present invention, the output terminals of the clock buffers are strapped by wires running orthogonal to the standard cell rows. In one embodiment, the row capacitance is computed taking into consideration the per row capacitance of the strapping wire.

According to another aspect of the present invention, the method is also applicable to circuits implemented by arrayed logic or macros. In such a region where standard cells may not necessarily be included, the method of the present invention allocates an assigned buffer area, as before, and for each instance receiving the clock signal, whether the instance is built from macro or arrayed logic, the method (a) estimates an input capacitance of the instance associated with the clock signal, and (b) estimates a wire capacitance based on a length of wire needed to couple the clock signal from the assigned buffer area to the instance. In such a region, the clock buffers are assigned based on the sum of the input capacitances of all the instances and estimates of the wire capacitances for connecting the clock buffers to the instances, and dividing such sum by the preferred load. By including in the method different approaches to buffer assignments for different regions of the circuit built using different building blocks, e.g. macros, arrayed logic and standard cells, the present invention allows the clock buffers in each region to be substantially equally loaded, so that clock skew can be uniform, regardless of the building block technology used in each region.

The method can be used to create a hierarchical clock distribution system, in which the clock buffers in the various assigned buffer areas throughout the chip are driven by a higher level set of clock buffers. According to that aspect of the present invention, the higher level clock buffers are assigned to a second level assigned buffer area. The number of clock buffers assigned to such second level assigned buffer area is computed by the number of lower level clock buffers that are to be driven, divided by the preferred load.

According to another aspect of the present invention, each level in the hierarchical clock distribution system are strapped together to minimize clock skew. Further, where the clock signals includes an operating clock and one or more test clocks, the operating clocks are routed between the test clocks, so as to be isolated from signal lines that are active during the time the operating clock is also active, thereby minimizing noise in the circuit.

The present invention is better understood upon consideration of the detailed description below and the accompanying drawings.

DETAILED DESCRIPTION OF THE PREFERRED EMBODIMENTS

The present invention provides a method and an automatic tool for (I) analyzing a logic circuit implemented by any combination of custom macros, arrayed logic elements, and standard cells, so as to estimate the expected capacitive loads of clock signals, (ii) determining the number of clock buffers necessary to drive these capacitive loads, so as to minimize clock skews, and (iii) causing the placements of such clock buffers and routing their output signals throughout the logic circuit. The method of the present invention uses a hierarchy of clock buffers to provide a distribution system for clock signals.

Figure 1:
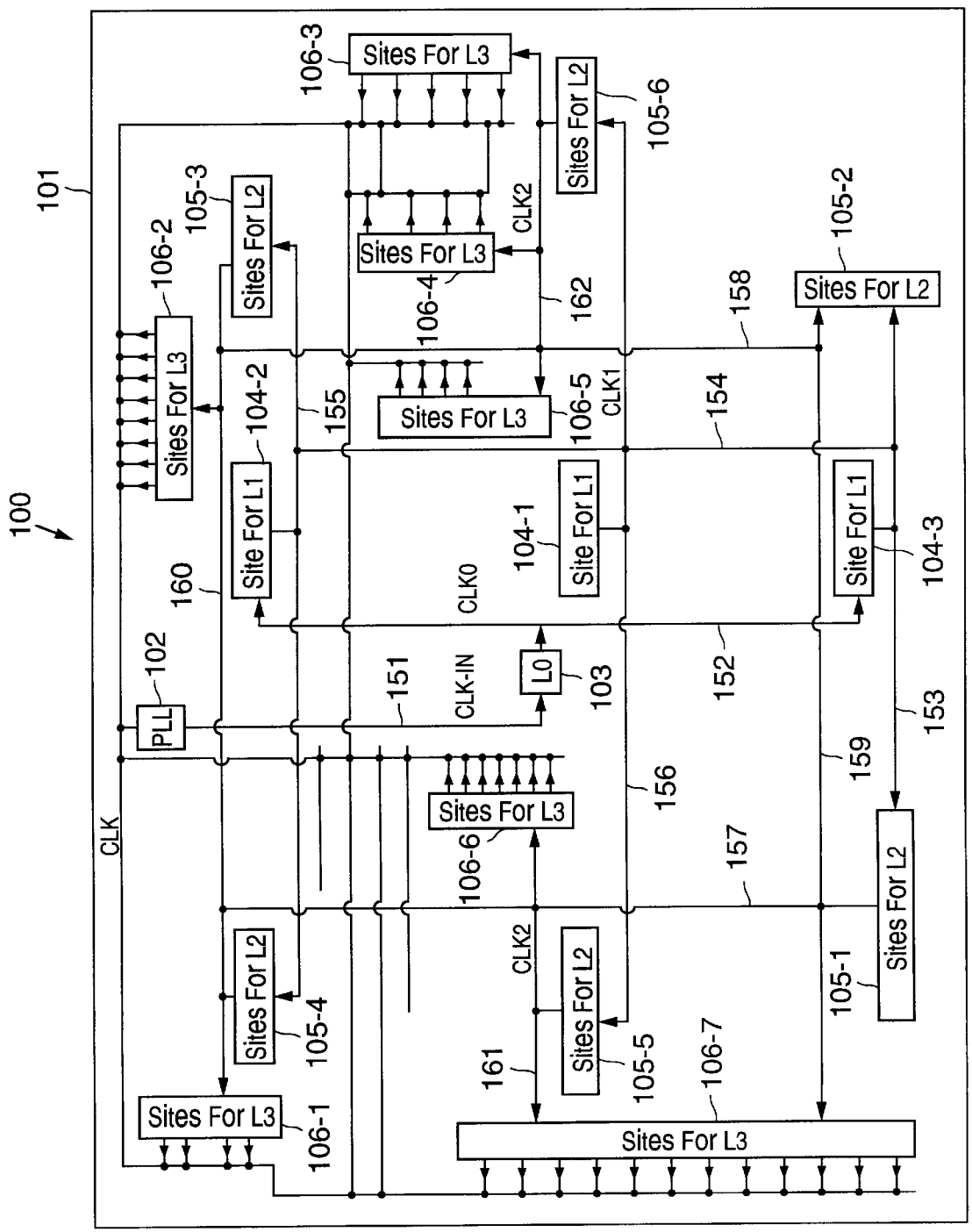
FIG. 1 shows a clock distribution system 100, implemented on an integrated circuit 101, in accordance with the present invention.

FIG. 1 illustrates the present invention by a clock distribution system 100, which is implemented in an integrated circuit 101. As shown in FIG. 1, integrated circuit 101 includes a phase-locked loop circuit 102, which provides a clock signal "CLK_IN" on a metal trace 151. Metal trace 151 is coupled to clock buffers 103. Although not shown, phase-locked loop circuit 102 receives an external reference clock signal as a time base. Clock buffers 103 together provide an amplified signal "CLK0" on metal trace 152, running in a direction orthogonal to metal trace 151. Signal CLK0 is coupled by metal trace 152 to clock buffers 104-1, 104-2 and 104-3. In turn, clock buffers 104-1, 104-2 and 104-3 together provide an amplified output signal "CLK1" on metal traces 156, 155, and 153, which are shorted or gridded by metal trace 154. Gridding allows the signal wavefront of clock signal "CLK1" to be as uniform as possible at all recipient locations of the signal, thereby minimizing clock skew. To this end, clock buffers 104-1 to 104-3 are preferably matched to each other in their respective drive characteristics. Using a large number of small identical clock buffers is one method for achieving uniformity. For convenience, clock buffers 104-1 to 104-3 are referred to as "level 1 buffers". Metal traces 153–156 couple clock signal "CLK1" to clock buffers 105-1 to 105-6. Clock buffers 105-1 to 105-6 together provide an amplified output signal "CLK2" on metal traces 159–162, which are shorted or gridded by metal traces 157–158, running orthogonally to metal traces 159–162, to become a single electrical node. Clock buffers 105-1 to 105-6 are referred to as "level 2 buffers". Finally, clock signal CLK2 are coupled by metal traces 157–162 to clock buffers 106-1 to 106-7 ("level 3 buffers") for distribution to all clocked elements of integrated circuit 101, e.g. flip-flops, registers and counters. Each of the level 3 buffers is responsible for driving the clock signal to clocked elements located within its respective specifically allocated area of integrated circuit 101. In this embodiment, although not necessary, all levels of clock buffers are gridded. In some applications, gridding at the lowest level may be sufficient to achieve the desired wavefront uniformity at the clocked elements. Although FIG. 1 shows four levels of clock buffers: a level 0 buffer (i.e. clock buffers 103), level 1 buffers, level 2 buffers and level three buffers, any number of levels of clock buffers can be implemented within the scope of the invention.

Clock distribution system 100 can be achieved by a method of the present invention to be discussed next. This method can be implemented in a computer program to work compatibly with conventional computer-aided design tools, such as logic synthesis tools, and cell placement and routing tools. An embodiment of the present invention is described in conjunction with a program ClockRoute2, which is implemented in a scripting language "Perl". The Perl language is well-known among those skilled in the art. The source code for ClockRoute2 is included herein as Appendix A. Subroutines that are discussed in the description below can all be found in Appendix A. Perl interpreters can be found in many computers running an implementation of the Unix operating system. The Unix operating system is also well-known among those skilled in the art.

Figure 3:
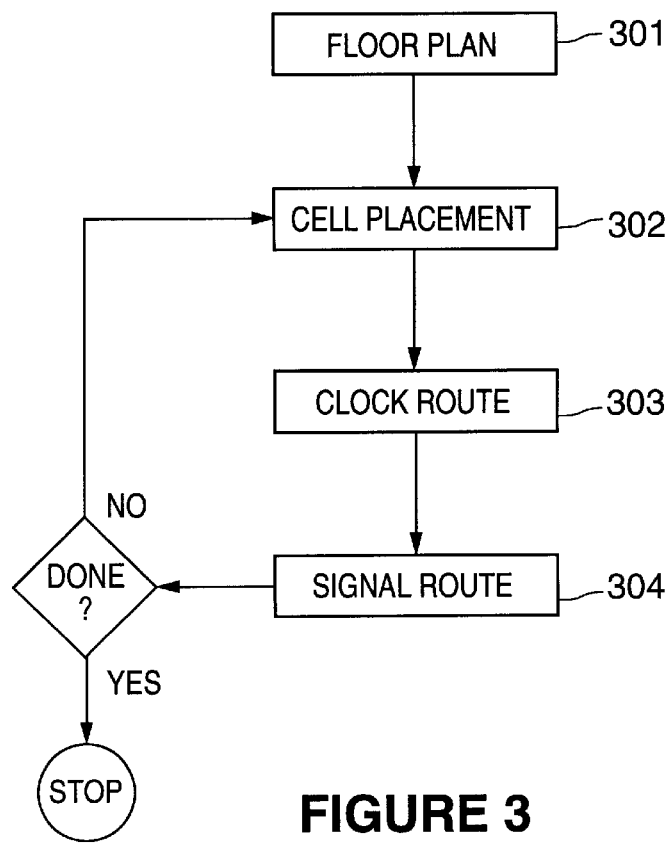
FIG. 3 illustrates one method of using program ClockRoute2 in conjunction with a standard cell design.

Program ClockRoute2 can be used in conjunction with a conventional automatic routing tool, such as Cell3, available from Cadence Design Systems, Inc., San Jose, Calif. For example, FIG. 3 illustrates how program ClockRoute2 can be used in the design activities of an integrated circuit which includes standard cells. First, a floor planning step 301 divides the "silicon real estate" of the integrated circuit into a number of regions, each including a preassigned clock buffer area. Division of the integrated circuit into regions is often determined by both the functionality required and the technology used. For example, one region may be allocated to an array of on-chip memory, which is to be separately considered from another region for control logic, since a memory circuit is often implemented by a custom macro and control logic is usually implemented by standard cells. In this example, floor planning step 301 also includes allocating room for routing wide metal traces for routing output signals of level 2 buffers and for strapping the input and output terminals of level 3 buffers. In the present example, all clock signals are routed using two metallization levels, referred to as "M4" and "M5". Typically, such metallization levels are required to be routed in orthogonal directions. For convenience, the direction along traces in M4 is referred to as "horizontal", and the direction along traces in M5 is referred to as "vertical". In this embodiment, wide M4 traces are used to route signals between level 2 buffers and level 3 buffers. Input and output terminals of Level 3 buffers are strapped by M5 metal traces.

After floor planning step 301 appropriately divides the integrated circuit, at step 302, a placement program is run to place standard cells into appropriate regions allocated by floor planning step 301. Prior to routing signals among the standard cells placed, program ClockRoute2 is called at step 303 to calculate, for each region, the number of actual clock buffers required, and to place them. As discussed below, program ClockRoute2 also places wires to connect the placed level 2 buffers and the level 3 buffers to the planned M4 and M5 traces provided at floor planning step 301. Step 303 also assigns M4 traces from the planned M5 traces to clocked elements of the instances placed in placement step 302. Because ClockRoute2 assign M4 and M5 traces prior to a router routes signals among the standard cells, clock signals are given precedence in the use of the integrated circuit's routing resources.

At step 304, a routing tool (e.g. Cell3) is called to automatically route signals among the standard cells and the clock buffers. The designer is then given a chance to evaluate the result of the routing. If any further modification is required, as is sometimes necessary, e.g. if additional requirement needs to be imposed on certain signals, steps 302–304 can be repeated until a satisfactory routing result is achieved.

Program ClockRoute2 receives three input files: (I) a control file, which provides input control data to program ClockRoute2, (ii) a "def" file, which lists the instances of pins, vias, components, and nets in the design, including their placement locations and cell types, and (iii) a "verilog" file, which provides the netlist of the design described in the "def" file. The verilog file is provided in the "Verilog" hardware description language, which is also well-known among those skilled in the art. An example verilog file is included herein as Appendix D for reference. The input verilog file includes dummy clock buffer cells. As discussed above, under the present invention, these dummy clock buffer cells are substituted by instantiation of actual clock buffer cells by program ClockRoute2, according to its estimation of wire and cell capacitances required to be driven by the clock buffers.

Program ClockRoute2 provides three output files: (I) a log file which reports errors and summary statistics and figures of merit, such as the number of buffers placed and the average capacitance driven by these buffers; (ii) a modified "verilog" file which includes the actual clock buffers which program ClockRoute2 substitutes for the dummy clock buffer cells in the input verilog file; (iii) an "Addwire" file, which lists addwire directives for instructing the routing tool Cell3 to route both the clock signals from the actual clock buffers to the instantiated cells of the "def" file and metal traces for gridding purposes; and (iv) a modified "def" file including the instances of the added clock buffers and vias. The Addwire file is in a format understood by the routing tool Cell3. Of course, upon consulting this detailed description, one skilled in the art would be able to modify program ClockRoute2 to accept the input files in other conventional hardware description language formats, to work with any conventional routing tool, and to provide output files in other conventional hardware description language formats.

Figure 2:
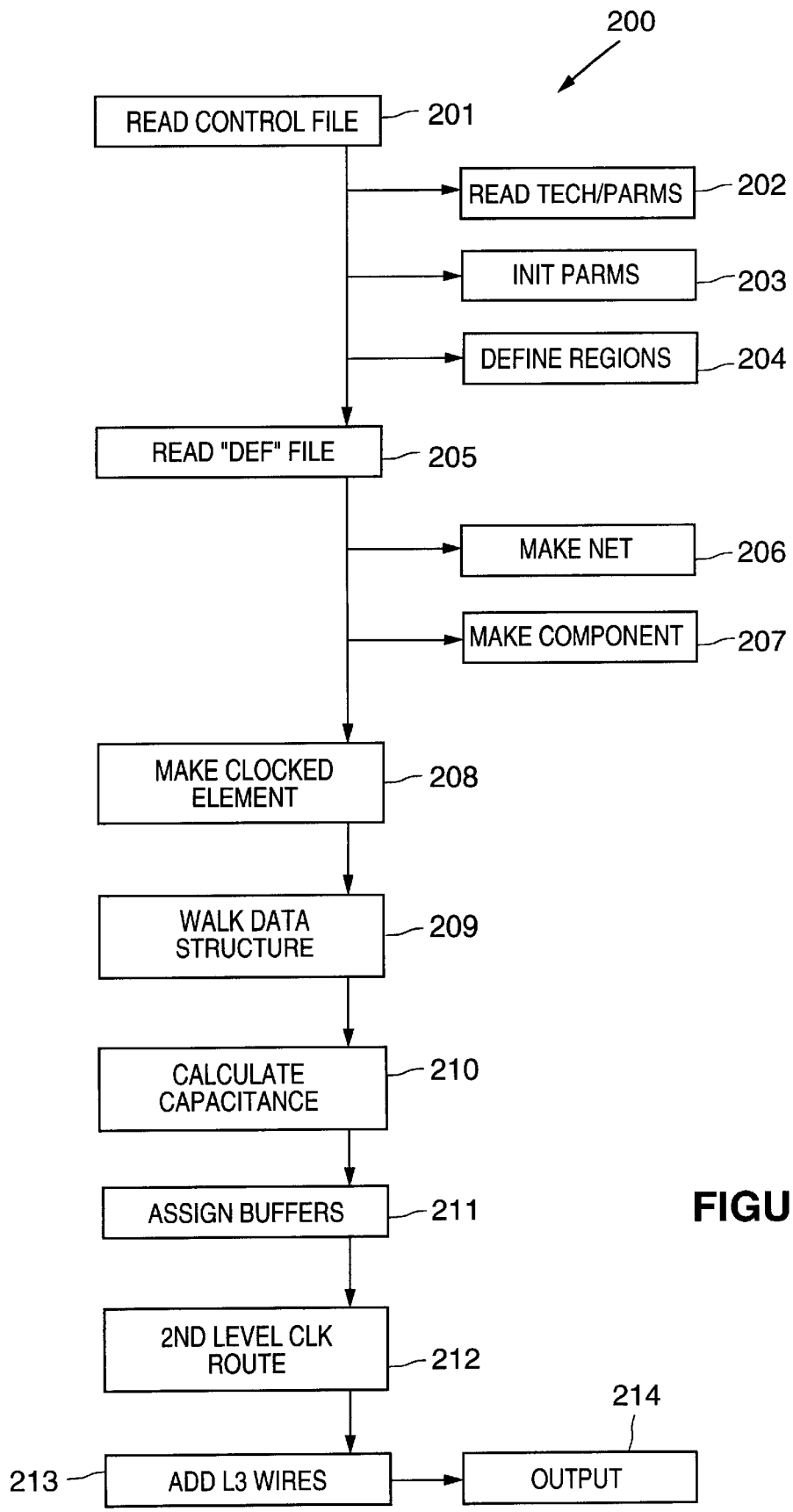
FIG. 2 is a flow diagram 200 illustrating the control flow of a program ClockRoute2, which is an embodiment of the present invention.

FIG. 2 is a flow diagram 200 illustrating the control flow of program ClockRoute2. In this example, to focus on the present invention, only two levels of clock buffering (level 2 buffers and level 3 buffers) are discussed. However, it would be apparent to those skilled in the art from this illustrative example of program ClockRoute2 that additional levels of clock buffering can be provided using the same principles discussed herein.

As shown in FIG. 2, at step 201, program ClockRoute2 parses the input control file. An example of the input control file is provided in Appendix C. The control file is read by the subroutine ReadControlFile. Subroutine ReadControlFile supports two types of directives: (a) global, and (b) clock regional. Global directives are applicable to the entire design. Clock regional directives are applicable only within a defined "box" or "clock region". The several types of defined clock regions are discussed below. Global directive supported include the following directives: "Techfile", "ParmFile", "Buffer", "ClockDriveMult", "Grid", "RowHeight", "RowLookahead", "M4Cap", "M4Mult", "M5Cap", "M5Mult", "M5Width", "Orientation", "L2Master", "L3Master", "BufCap", "AllowClock", "DeleteCells", "BlockedCell", "M5Offset", "AddWire", "C4Row", "M4Row". Clock regional directives are set forth along with each clock region defined by the "ClockBox", "SPBox", and "L2Box" directives. The "ClockBox" directive is usually used to define clock regions for standard cell blocks. The "SPBox" directive is typically used to route clock signals in arrayed logic blocks. Higher level clock regions are specified by the "L2Box" directive. Within a clock region defined by ClockBox, the following directives are supported: "Buf", "NumBuf", "NoBuffer", "Load", "RowPreWire", "NoWire", "RowStrapToEdge", "NoStrap", "RightStrap", and "LeftStrap". Within a clock region defined by "SPBox" ("special region"), the directive "Place"

is supported. Within the clock region defined by directive "L2Box" ("second level region"), the directives "Wireload", "Buf", "NumBuf", and "NumRow" are supported.

The "TechFile" and the "ParmFile" directives references a technology and a parameter file, respectively. The technology file contains the per unit length capacitances for minimum-width metal traces in the metallization levels. A parameter file contains the capacitances for the cells specified in the file. Typically, there may be a number of parameter files, but one technology file. At step 202, subroutine ReadControlFile calls subroutine ReadTechFile to read the technology file. Similarly, subroutine ReadControlFile calls subroutine ReadParm to read a parameter file.

ReadControlFile initializes parameters used in subsequent capacitance estimation and clock signal routing as it reads the remaining global directives at step 203. The directive "Buffer" defines the clock buffer to be used. Directive "Buffer" receives the name of the buffer cell, the optimal load capability, the names of the input and output signals in the cell definition, the input capacitance for the cell, and other dimensional attributes of the buffer cell. In the example control file of Appendix C, the "Buffer" directive specifies a buffer cell "L3CKBUF" to be 1800 data base unit wide and having a 0.7 pF optimal drive capability. The directive "ClockDriveMult" allows program ClockRoute2 to use, in conjunction with a specified signal, a specified factor to scale the buffer cell's optimal drive value when the buffer cell is used to drive the specified clock signal. ClockDriveMult is useful, for example, for a design with scan test capability. In such a design, as shown in the control file of Appendix C, the scan clock SC1, which is only used during testing, can be scaled by the factor 4. In other words, in that example, buffer cell L3CKBUF would have an optimal drive capability of 2.8 pF for clock signal SC1 and 0.7 pF for clock signal PH1. The ClockDriveMult directive conserves routing resources for by allowing selected clock signals to be driven at a higher skew tolerance. For example, while clock signal PH1 is expected to operate at a clock rate exceeding 150 MHz, scan clock SC1 may operate only at a rate of 10 MHz, and thus can tolerate a much higher clock skew.

The directives "Grid" and "RowHeight" respectively specify the spacing between grid points in database units and the height of a standard cell in that design, also in database units. For example, in Appendix C, grid points are specified to be 180 data base units apart, and each standard cell is 3240 data base units tall. The directive "RowLookahead" defines a "window", specified by a number of rows of standard cells, within which program ClockRoute2 takes into consideration all capacitances seen by a clock signal in computing for the assignments of actual clock buffers at any given time. The control file of Appendix C, for example, specifies a RowLookAhead of 2, representing a window including only two rows of standard cells, or 6560 data base units in the y-coordinates.

The directives "M4Cap", "M4Mult", "M5Cap", "M5Mult" define respectively the per unit length capacitance for a minimum-width metal trace in M4, a multiplier to scale the value of M4Cap, the per unit length capacitance for a minimum-width metal trace in M5 and a multiplier to scale the value of M5Cap. M4Mult and M5Mult are provided to allow capacitances be calculated based on wires that are wider than minimum-width. In this detailed description, the terms "wire" and "metal trace" are used interchangeably, unless particularly noted.

The directive "M5Width" specifies the width of an M5 strap to be used with the input and output signals of a clock buffer. In the example of Appendix C, a M5Width of 260 data base units is specified. The directive "Orientation" defines the orientation of the clock buffer cell, with respect to the ground rail of the "bottom" standard cell row. In this detailed description, the terms "top" and "bottom" refer to the greatest y-coordinate and the least y-coordinate, respectively. Current orientations supported are (I) "N", which is the orientation of a standard cell with the ground rail at the bottom, (ii) "S", which is an "N" standard cell reflected about the X-axis, (iii) "FN", which is the "N" standard cell reflected about the Y-axis, and (iv) "FS", which is the "S" standard cell reflected about the Y-axis. All cells in a standard cell row, including any clock buffer cell, should have the same orientation. A cell placed in an incorrect orientation risks shorting the power rails.

The "L2Master" and "L3Master" directives define the names of the dummy clock buffer cells for level 2 buffers and level 3 buffers, respectively. For example, in the control file of Appendix C, dummy buffer cells "Buf_MASTER_CLK3", "Buf_MASTER_SC13", and "Buf_MASTER_SC23" represents preassigned buffer areas for placing level 3 buffers of clock signals "PH1", "SC1", and "SC2" respectively. The "BufCap" directive specifies the input capacitance to be used with the clock buffer cell. The "AllowClock" directive, which receives as arguments the names of a pin and a cell, allows a clock signal to connect to the specified pin of the specified cell. The "DeleteCells" directive deletes, from the "def" file, cells with names matching a regular expression (e.g. in the control file of Appendix C, the regular expression "EROM_ROMBIST_SUB_297U1n" is used, where n is any string of numerals). The "BlockedCell" directive defines a cell for special handling. In this implementation, special handling requires AddWire statements to be confined to the top or bottom of the cell, and prevents routing of any strapping or prewires (discussed below) within the cell (i.e. no routing of clock signals over the cell).

The directive "M5offset" defines a value to be used when offsetting an M5 metal trace. The directive "AddWire" specifies a wire to be added. "AddWire" can be specified with either the "viasat" or the "noviasat" keyword, both inside and outside a clock region. When specified with the "viasat" keyword, the wire added by the AddWire directive will also be shorted by vias to all metal traces the added metal trace crosses which carry the same signal. The "C4Row" directive defines rows where M5 wires turn to avoid "C4 pads"[1]. No strapping or prewires can thus be added to a row specified by directive "C4Row". The directive "M4Row" defines where M4 (i.e. horizontal") strapping to the locations of input and output pins of the level 2 buffers occur. M4Row also associates a clock set with each of the input and output pin locations. A clock set defines the vertical order, with respect to a power rail, in which the clock signals in the clock set should appear. For example, in the control file of Appendix C, the M4Row statement specifies M4 straps in rows 0 and 1 (i.e. 3240) for the input and output terminals of level 2 buffers, respectively, with an offset of 720 for the input clock set {SC1_1 PH1_1 SC2_1} and an offset of 945 for the output clock set {SC1_2, PH1_2, SC2-2}.

[1] C4 pads are special structures in this implementation formed in M5 to allow the integrated circuit to be bonded to a "flip chip" package. C4 pads are neither necessary nor related to the practice of the present invention.

Figure 4:
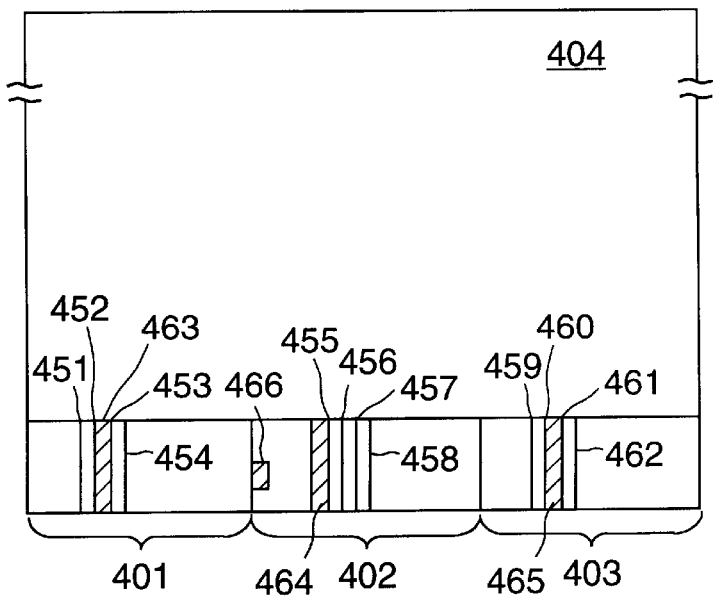
FIG. 4 depicts an example of locations for four ClockBoxes, 401–404.

Upon completing initialization; ReadControlFile reads in the clock regions at step 204 (FIG. 2). As mentioned above, three kinds of clock regions can be specified: ClockBox, SPBox and L2box. Each kind of clock region can be specified by location. In addition, an SPBox can be specified by instance name, as in the example of the control file of Appendix B. FIG. 4 shows the locations of the four Clock-Boxes and an L2Box in the example of Appendix C. In program ClockRoute2, each clock region is specified by a name and its lower-left and upper-right x- and y-coordinates. Thus, in the example of Appendix C, Clockbox ClockBox1 is provided lower-left coordinates of (0,0) and upper-right coordinates (150000, 16200), which is shown qualitatively (i.e. not to scale) in FIG. 4 as clock region 401. Likewise, ClockBox2, ClockBox3 and ClockBox4 are shown in FIG. 4 as clock regions 402, 403 and 404 respectively. As specified, ClockBox1, ClockBox2 and ClockBox3 each have a height of five rows of standard cells. L2Box l2box1 of Appendix C, having lower-left and upper-right coordinates (0,0) and (445680, 16200), overlaps clock regions 402, 403 and 404. In FIG. 4, M5 metal traces 451 and 452 are provided in clock region 401 for strapping the input terminals PH1_2 and SC1_2 for the clock buffers of clock signals PH1 and SC1. Likewise, M5 traces 453 and 454 are provided for strapping the output terminals PH1 and SC1 of the clock buffers of signals PH1 and SC1. M5 traces 451–454 are specified by directive "ClockWire", which defines, for a specified clock signal, the center x-coordinates of M5 traces for strapping the input and output pins of the clock buffers. In the same manner, M5 traces 455–458, 459–462 are provided for strapping of input and output terminals of the clock buffers of clock regions 402 and 403. In clock region 401, the shaded area 463 between M5 traces 452 and 453 represents the preassigned buffer area, i.e. dummy buffer cells, for placing the clock buffers. The location of the preassigned buffer area is specified by the "Buf" directive. Similarly, shaded areas 464 and 465 represent the preassigned buffer area for clock regions 402 and 403. These preassigned buffer areas, although shown in FIG. 4 to between the M5 traces in clock regions 401 and 403, and to the left of the M5 traces in clock region 402, can be located anywhere within the clock region. Area 466 is the area of the preassigned buffer area for level 2 buffers of L2Box l2box1.

In a ClockBox, the clock buffer rows are arrayed vertically, each row providing a number of sites specified by the "NumBuf" directive. When a buffer is placed within the allocated site, the input pin of the clock buffer instance is then strapped by an M4 trace to the M5 metal trace strapping the input clock signal. Likewise, the output pin of the clock buffer instance is strapped by an M4 metal trace to the corresponding M5 metal trace of the output clock signal. Actual connection to the input and output pins are performed by the router, such as place and route tool Cell3 mentioned above.

The "RowPreWire" directive instructs program Clock-Route2 to place a wire at specified row intervals for routing a specified clock signal. Wires specified by the "Row-PreWire" directives are the allowed M4 wires for coupling the M5 trace driven by the output terminals of clock buffers and the clocked elements driven by the clock signal. For example, in the control file of Appendix C, the RowPreWire directive in Clockbox1 specifies for clock signal PH1 an M4 wire every two rows. In this embodiment; since each standard cell row provides 18 routing tracks, the RowPreWire directive essentially specifies one track per 36 tracks to be used for routing clock signal PH1. As mentioned above, gridding of clock signals are desirable. Gridding is accomplished by the "RowStrapToEdge" directive which specifies the periodic row interval at which M4 wires extending to the edges of the clock region are provided. In ClockBox1 of Appendix C, the RowStrapToEdge directive specifies that such M4 straps that run across the clock region are provided every four rows. By extending these straps to the edge of the clock region, and by properly specifying such M4 straps in adjacent clock regions, the same clock signal in different clock regions are strapped together.

The directives "NoBuffer", "NoWire" and "NoStrap" specify, respectively, a location (NoBuffer) or a range of locations (NoWire and NoStrap), at which no buffer, no wire and no strap can be placed. The directive "LeftStrap" ("RightStrap") specifies a range of y-coordinates between which straps extend only to the left (right) edge of the ClockBox. "LeftStrap" and "RightStrap" are useful directive when an adjacent clock region does not provide a strap to the edge abutting the present clock region, so that it would not be necessary that the current clock region extends an M4 strap to that edge. In those instances, the M4 trace extends as far as the last clocked element in the row. The "Load" directive specifies the input capacitance of a pin in an instance within the ClockBox. The input capacitance could be a numerical value in picoferads or the name of a parameter file storing the input capacitance value. The "Load" directive is particularly useful for providing the input capacitance of a custom macro.

Special clock regions ("SPBoxes") can be specified by either location or instance name, using the "SPBox" directive. With respect to an SPBox, the program ClockRoute2 calculates and assigns the necessary number of buffers, but does not generate any routing or strapping directives to the routing tool. In an SPBox, the designer retains control for handcrafting the clock distribution system within the SPBox. Of course, the user can also include AddWire statements, which would be passed along to the router. For example, in Appendix C, a M3 metal trace is added to the net of signal InEromBox, extending between coordinates (20200, 0) and (20,200, 9720). The "Place" directive defines a location at which a clock buffer is placed.

The "L2Box" directive defines the area over which clock buffers are to be assigned to drive clock buffers of a lower level. Typically, the designer would specify a dummy buffer cell site in the L2Box, using the "Buf" directive, the number of rows ("NumRow" directive) in the L2Box and the number of clock buffers per row ("NumBuf" directive). The capacitances of M4 traces, provided by the floor planning step, for the input and output terminals of level 2 buffers are provided to program ClockRoute2 by the "WireLoad" directives.

As subroutine ReadControlFile reads the control file, appropriate value-checking is performed. For example, for the "NoWire" directive, the y-coordinate arguments are checked against the y-coordinate extent of the ClockBox to ensure that the "NoWire" directive is properly specified within the boundaries of the ClockBox. Further, additional useful parametric values are derived, where appropriate. For example, when a ClockBox is defined, the number of rows within the box is calculated based on the coordinate arguments supplied in the ClockBox directive and the row height obtained from a previous RowHeight directive.

Having read the control file, program ClockRoute2, at step 205, reads the "def" file. The "def" file for this example is provided in Appendix B. As mentioned above, the "def" file lists the instances of pins, vias, components, and nets in the design, including their placement locations and cell types. As shown in the "def" file of Appendix B, a list of components are set forth between the keywords "COMPONENTS" and "END COMPONENTS". Likewise, the nets are set forth between the keywords "NETS" and "END NETS", with the list of instances on each signal net set forth after a "−" and the signal name. The "def" file is read by the subroutine "ReadDef". Subroutine ReadDef creates data structures for the nets and the components, respectively, at steps 206 and 207, calling the subroutines ProcessClockNet, ProcessSPNet and ProcessComponents.

For each instance listed in a net of the "def" file, an entry is created in either the array "OnNet" (for a net in a ClockBox) or the array "SPNet" (for a net in an SPBox), to contain a signal name (i.e. the name of the net) and the name of the pin at which the signal is associated. If the entry is already in existence, i.e. the instance has already appeared in a previously encountered net, the signal name and the pin name are appended to the existing entry. The arrays OnNet and SPNet, which are created by string operations in subroutines ProcessClockNet and ProcessSPNet respectively, are indexed by the instance name. Subroutine ProcessComponents creates three arrays for the components or instances of the design: "CompType", "CompX" and "CompY". Each of these arrays is indexed by an instance name. Corresponding entries of CompType, CompX and CompY record the instance type and the lower-left x-coordinate and y-coordinates of an instance. Subroutine ProcessComponents also checks the orientation of each cell and marks those cells specified in a BlockedCell directive.

At step 208, program ClockRoute2 calls subroutine RemoveNonClockedElems to remove the dummy buffer cells from the OnNet array, and to place the instances inside all SPBoxes into arrays "SPBoxType" and "SPType", which are each indexed by both the instance name and the signal name. Array SPBoxType stores the name of the SPBox, and the array SPType records the instance type. Subroutine RemoveNonClockElems also creates an array AtY, which is indexed by row (i.e. y-coordinates), for storing a list of instances at each Y position.

At step 209, program ClockRoute2 calls the subroutines ProcessStdCellRows, LimitWiresToAssignedRows and AddStraps to process the data structure created thus far. Subroutine ProcessStdCellRows creates arrays ExtraLoadNet, SPCAP, SPCount, RowMostX, RowGate, RowDevice, BoxDevices and Wirelength. ExtraLoadNet is an array of signal names, indexed by instance name and pin name, for each instance and pin for which a capacitance is defined by a "Load" directive. Arrays SPCap and SPCount, which are each indexed by a SPBox name and a signal name, are arrays of the total capacitance associated with that signal in that SPBox, and the number of pins for which capacitance is accounted for within that SPBox, respectively. RowMostX, RowGate and RowDevices, which are each indexed by the signal name, row number and ClockBox name, provide for each row (a) the length of the M4 metal trace necessary to route the signal to the furthest cell in the row receiving the signal, (b) the total capacitance associated with the signal, and (c) the number of devices associated with that signal. Array BoxDevices, which is indexed by the signal name and a clock region, contains the total number of devices associated with the signal. Array Wirelength, which is indexed by a clock region and a signal name, contains the total wire lengths associated with the signal in each clock region. Array WireLength is used at this time to report, for each row, the distances between the furthest clocked elements receiving the clock signal.

To create the arrays of subroutine ProcessStdCellRows, subroutine ProcessStdCellRows traverses array AtY in the order increasing row order. For each list of instances at each Y coordinate, subroutine ProcessStdCellRow examines each instance in increasing x-coordinate order. For each pin in each instance, the signal name associated with the pin is entered into array ExtraLoadNet, if a previous "Load" directive defines a extra capacitance for that instance type and pin. If the instance is included in an SPBox, the SPCap and the SPCount arrays are updated, to include the instance's contribution of capacitance and pin count in the SPBox. For each row and signal name, ProcessStdCell (a) notes in the corresponding entry of array RowMostX the x-coordinate of the pin furthest in the x-direction from the dummy buffer cells, (b) accumulates in the associated entry of array RowGate the total capacitance, and (c) accumulates in the corresponding entry of array RowDevices the number of pins encountered. For each clock region and signal, the total number of pins encountered is accumulated in the corresponding entry of array BoxDevices. Finally, for each clock region, the wire lengths associated with each signal is calculated from the data in array RowMostX and the extant of the clock region.

After subroutine ProcessStdCellRows completes, program ClockRoute2 calls subroutine LimitWiresToAssignRows. Subroutine LimitWiresToAssignRows removes, for each signal of each clock region, rows for which routing of the signal is prohibited by a "NoWirel" directive, a "C4Row" directive, or which falls on a row between the allowed M4 wires in a "RowPreWire" directive. In subroutine LimitWiresToAssignedRows, a RowLeastX array, similar to the RowMostX array, is updated to provide the least x-coordinate of each wire. Program ClockRoute2 then calls subroutine AddStraps to strap (i.e. extend the wires for gridding) the wires of each clock signal and clock region, by updating the corresponding entries in arrays RowLeastX and RowMostX at each row where a RowStrapToEdge, LeftStrap or RightStrap directive defines a strapping.

At step 210, i.e. upon completing execution of subroutine AddStraps, program ClockRoute2 calls subroutine TotalCap to compute the total capacitance in each row associated with each clock region. The results are stored in an array RowCap, which is indexed by the clock region, row number and signal. Each entry in array RowCap is obtained by summing (a) the capacitance in an corresponding entry in RowGate, i.e. the input capacitance associated with the signal, (b) the per row capacitance of the M5 metal trace, i.e. the per row capacitance of the vertical metal trace at the output of the clock buffers, and the total capacitance of the M4 wire computed from the corresponding entries in arrays RowLeastX and RowMostX. The capacitance value for each wire is obtained by multiplying its length to its per unit length capacitance, which provided by the technology file and the M4Mult or M5Mult directives. Finally, for each net, if an extra load value is defined by a "Load" directive for that clock region, the extra load is added to the corresponding entry of array RowCap.

At this point, for each clock region, the total capacitance seen by each clock signal at each row is provided in array RowCap. Program ClockRoute2 then, at step 211, calls subroutine AssignBuffersAndInputViasAndWires ("ABIVW") to assign clock buffers. Subroutine ABIVW defines a sliding window which includes the number of standard cell rows defined in the "RowLookAhead" directive. In each clock region, for each row at which a buffer can be added, i.e. not a row specified in a C4Row directive, subroutine ABIVW determines a number of buffer to be added, using the equation:

$$NumBuf = int\left(\frac{CurrCap}{ClkDrive * Rows\ left} + 0.5\right)$$

where (a) NumBuf is the number of clock buffers to be added to the current row; (b) CurrCap is the remaining capacitance within the window for that signal; (c) ClkDrive is the optimal load for the clock buffer; (d) Rows left is the number of rows left for which clock buffers can be added; and (e) "int" is the function which truncates a real number to the largest integer less than the real number.

In the above equation, the value 0.5 is added to ensure a clock buffer is added when more than half a clock buffer is required. Thus, in this method, the number of clock buffers assigned is such that the average load on each clock buffer is substantially the same (i.e. approximately the optimal load) every where on the integrated circuit. By using a large number of identically sized clock buffers, the present invention avoids clock skew due to device mismatch.

The clock buffers are added horizontally. Subroutine ABIVW then checks if each clock buffer is properly strapped to the M5 wire at the output terminal of the dummy buffer cell. If no strap wire is present to strap to the M5 wire, a new M4 wire is added to provide the strapping. If an M4 wire is already present, but does not extend to the one or more of the added clock buffers, an additional length of M4 metal trace is included in the M4 strap. In either situation, i.e. no strap wire or an inadequate strap wire, the total capacitance for the window is recomputed, using the additional capacitance in the new or extended M4 wire. The number of clock buffers needed to be added to the row is then recomputed. The procedure is repeated until no new wire or extension is required from the last buffer added. In this embodiment, at least one clock buffer is added, if either no buffer is yet present in the current clock region, or if the remaining capacitance is greater than the optimal load for a clock buffer. The added clock buffers are then included in a netlist data structure, for holding references to these clock buffers for output, at a subsequent step, to the modified verilog file.

Subroutine ABIVW then calls subroutine AddInputWiresAndVias. Subroutine AddInputWiresAndVias provides M4 traces to connect the input terminals of a clock buffer to the M5 straps driven by the level 2 buffers. In this embodiment, two signal tracks are provided at both the top and the bottom of each row, the two power rails are located inside these outside tracks, and there are ten signal tracks between the power rails. In M4 rows (i.e. rows at which the floor planning step has allocated metal traces for strapping level 2 buffers), however, the wide M4 straps run between the power rails, so that only one track is available between the power rail, immediately below the upper power rail. Typically, subroutine AddInputWiresAndVias assigns the center track between the rail to the first clock signal, and then assigns to other clock signals the tracks above and below the center track, alternating between tracks above and below the center and in order of increasing distance form the center track. In M4 rows, however, the clock signals are routed in the two tracks below the lower power rail (the tracks above the above and immediately below the upper power rail are reserved for the output wires of the level 3 clock buffers). Subroutine AddInputWiresAndVias then places a via to connect the M5 strap to the added M4 wire[2]. Subroutine AddInputWiresAndVias also calls subroutine ProcessWire to merge the added M4 wire with any previously added overlapping M4 wire of the same track, such as an M4 wire to an adjacent clock buffer. The added and processed wire is then included in a wire data structure, which is used at a subsequent step for outputting to the Addwire file. The window is then advanced one row until the entire clock region is scanned. Summary statistics and error conditions, e.g. more clock buffers are needed than actual room available, are reported for each clock region. Subroutine ProcessPlacedElems is then called to include into the netlist data structure the clock buffers added in the SPBoxes by the Place directives.

[2] In this embodiment also, since the vias between M4 and M5 are each wider than a minimum-width M4 trace, to minimize spacing between tracks, the design rules provide that a via, depending on which track it is on, encroaches only the assigned one of the two neighboring tracks. For example, the vias on the center track and the second track above the center track encroach only the track in between. Under this scheme, maximum density of tracks can be achieved.

At step 212, program ClockRoute2 then assigns and routes second level clocking buffers and clock signals, by calling subroutines ProcessL2Buffers. Subroutine ProcessL2Buffers sums, for each L2Box and a clock signal driving a level 3 buffer, the total capacitance within the L2Box associated with that clock signal and places the result into an array L3Cap. Array L3Cap is indexed by an output clock signal of a level 2 clock buffer. To each entry of array L3Cap (i.e. for each clock signal) is then added any addition load value specified in a "WireLoad" directive for that clock signal. The number of clock buffers necessary for that clock signal in that clock region is then computed by the equation:

$$L2NumBuf = int\left(\frac{L3Cap[signal]}{optimal\ load} + 0.5\right)$$

where (a) L3NumBuf is the number of clock buffers to be added in the L2Box; (b) L3Cap[signal] is total capacitance for that clock signal in that L2Box; and (c) optimal load is the optimal load for the level 2 clock buffer.

The added buffers by ProcessL2Buffers are then included in the netlist data structure for subsequent output to the modified verilog file. Subroutine ProcessL2Buffer then calls subroutine PlaceL2Wire to place M5 wires to connect the input and output terminals of the added clock buffers to the M4 straps provided by the floor planning step. These wires are merged by subroutine ProcessL2Wire, which is similar to subroutine ProcessWire described above. The vias between M4 and M5 traces are added by subroutine AddL2Via.

Program ClockRoute2 then calls, at step 213, subroutine AddOutputWiresAndVias, to provide M4 wires to connect the output terminal of the clock buffer and the clocked elements to the M5 straps. The operations of subroutine AddOutputWiresAndVias is substantially the same as subroutine AddInputWiresAndVias described above. Subroutine AddOutputWiresAndVias also calls subroutine ProcessWire to merge the newly added wires. These wires are then included in the wire data structure for generating AddWire directives to the routing tool at the subsequent routing step.

Finally, at step 214, program ClockRoute2 calls subroutines WriteDef, WriteWire and WriteVerilog to provide the modified "def" file, the AddWire file and the modified verilog file respectively. An example of a modified "def" file, an "Addwire" file and a "modified verilog file", output from a run of program ClockRoute2, using the control file, def file and the verilog file of Appendices B–D, are provided as Appendices E, F and G respectively. An output log file of the run is also included herein as Appendix H.

The detailed description above is provided to illustrate the specific embodiments of the present invention and is not intended to be limiting. Numerous variations and modifications are possible within the scope of the present invention. The present invention is defined by the appended claims.

What is claimed is:

1. A method for achieving minimal clock skew in an integrated circuit, the integrated circuit including a circuit placement area in which are placed a plurality of building blocks arranged in a plurality of rows, one or more of said rows being designated for placement of clock buffers that generate a clock signal, the steps including:

for each row of said plurality of building blocks:
(a) identifying terminals of said building blocks designated for receiving said clock signal; and
(b) determining a capacitance associated with electrically coupling the clock signal from clock buffers in an assigned buffer area to the identified terminals of said building blocks in said row;

summing said capacitance in each row, over all rows in said circuit placement area, to determine a total capacitance for said circuit placement area; and for each row designated for placement of clock buffers, assigning a number of clock buffers to be placed in said designated row based on said total capacitance, after deducting from said total capacitance an amount of capacitance equal to loads driven by clock buffers assigned in previous designated rows, and the number of said designated rows yet to have clock buffers assigned.

2. The method of claim 1 wherein the step of determining the capacitance further includes the steps:

associating an input capacitance with each identified terminal of said building blocks;

deriving a wire capacitance associated with the building blocks in said row, the wire capacitance being derived by estimating a total length of wires necessary to electrically couple the clock signal from the assigned buffer area to the identified terminals of said building blocks, wherein the capacitance being determined is a sum of the input capacitances associated with said identified terminals and the wire capacitance.

3. A method as in claim 2, further comprising determining, for each row of said building blocks, a maximum wire distance between said assigned buffer area to said building blocks.

4. The method of claim 1 wherein the step of determining a number of clock buffers further includes the step:

dividing the total capacitance by an optimal load capacitance for a clock buffer.

5. A method as in claim 1, providing clock buffers to connect said assigned clock buffers to a clock generation circuit.

6. A method as in claim 1, wherein said assigning takes into consideration, for each clock signal in said designated row, capacitance in an area within a predetermined number of rows of standard cells of said designated row.

7. A computer program embodied on a computer-readable medium for achieving minimal clock skew in an integrated circuit, the integrated circuit including a circuit placement area in which are placed a plurality of building blocks arranged in a plurality of rows, one or more of said rows being designated for placement of clock buffers that generate a clock signal, comprising:

a code segment that,
(a) for each row of said plurality of building blocks, identifying terminals of said building blocks designated for receiving said clock signal; and determines a capacitance associated with electrically coupling the clock signal from clock buffers in an assigned buffer area to the identified terminals of said building blocks in said row; and
(b) summing said capacitance in each row, over all rows in said circuit placement area, to determine a total capacitance for said circuit placement area; and a code segment that, for each row designated for placement of clock buffers, assigning a number of clock buffers to be placed in said designated row based on said total capacitance, after deducting from said total capacitance an amount of capacitance equal to loads driven by clock buffers assigned in previous designated rows, and the number of designated rows yet to have clock buffers assigned.

8. The computer program of claim 7 wherein the code segment that determines a capacitance further includes:

a code segment that associates an input capacitance with each identified terminal of said building blocks;

a code segment that derives a wire capacitance associated with the building blocks in said row, the wire capacitance being derived by estimating a total length of wires necessary to electrically couple the clock signal from the assigned buffer area to the identified terminals of said building blocks, wherein the capacitance being determined is a sum of the input capacitances associated with said identified terminals and the wire capacitance.

9. A computer program as in claim 8, further comprising a code segment for determining, for each row of said building blocks, a maximum wire distance between said assigned buffer area to said building blocks.

10. The computer program of claim 7 wherein the code segment that determines a number of clock buffers further includes:

a code segment that divides the total capacitance by an optimal load for a clock buffer.

11. A computer program as in claim 7, further comprising a code segment for providing clock buffers to connect said assigned clock buffers to a clock generation circuit.

12. A computer program as in claim 7, wherein said assigning takes into consideration, for each clock signal in said designated row, capacitance in an area within a predetermined number of rows of standard cells of said designated row.

* * * * *